United States Patent [19]

Chen

[11] Patent Number: 5,287,249
[45] Date of Patent: Feb. 15, 1994

[54] FIN ASSEMBLY FOR AN INTEGRATED CIRCUIT

[75] Inventor: Chien-Chang Chen, Yi Lan Hsien, Taiwan

[73] Assignees: Global Win Technology Co., Ltd.; Huei Bin Enterprise Corp., both of Taiwan

[21] Appl. No.: 88,845

[22] Filed: Jul. 7, 1993

[51] Int. Cl.$^5$ .............................................. H05H 7/20
[52] U.S. Cl. .................................. 361/718; 165/80.3; 165/185; 257/719
[58] Field of Search ............................ 165/80.3, 185; 174/16.3; 257/707, 713, 718–719, 722; 361/690, 695, 697, 703–704, 709–710, 718

[56] References Cited

U.S. PATENT DOCUMENTS

| | | | |
|---|---|---|---|
| 3,798,506 | 3/1974 | English | 174/16.3 |
| 4,660,123 | 4/1987 | Hermann | 361/386 |
| 5,168,926 | 12/1992 | Watson et al. | 361/386 |
| 5,241,453 | 8/1993 | Bright et al. | 361/704 |

Primary Examiner—Gregory D. Thompson
Attorney, Agent, or Firm—McCubbrey, Bartels, Meyer & Ward

[57] ABSTRACT

A fin assembly includes a fin, a pair of mounting pieces for removably mounting the fin to an integrated circuit. The fin includes a bottom surface for contacting an upper surface of the integrated circuit and an upper surface from which a plurality of ridges extend. An extension extends downward from each side of the bottom surface, such that the distance between the two extensions is equal to the width of the integrated circuit. On at least one of the mutually facing walls of each outermost ridge and its corresponding adjacent ridge, a groove extends along the length of each ridge. Each mounting piece includes a base and two beveled sides each extending downward to form a distal snapping end. A pair of pins extend upward from a top of the base, such that a fan may be mounted by passing the pins through pin holes in the corners of the fan. A plurality of protuberances projects from each of two lateral sides of the base, such that when the base of the mounting piece is inserted into the channel defined by each outermost ridge and its corresponding adjacent ridge, the protuberances are fittingly received in the grooves in the ridges, thereby retaining the mounting piece. Preferably, the snapping end extends in a direction parallel to the extending direction of an end surface of the protrusion which projects outward from each corner of the integrated circuit to provide a surface contact therebetween.

4 Claims, 4 Drawing Sheets

FIN ASSEMBLY FOR AN INTEGRATED CIRCUIT

BACKGROUND OF THE INVENTION

1. Field of the Invention

The present invention relates to a fin assembly for an integrated circuit.

2. Description of the related prior art

Integrated circuits are widely used in computers and daily devices. It is found that temperature is the most important factor to the normal operation of an integrated circuit. To assist the dissipation of heat generated by the integrated circuit and thus reduce the possibility of damage of the same, devices have been developed, one type of which is a fin plate mounted by snapping members to the integrated circuit and a fan is mounted by screws to the fin plate. It has been found that the fin plate still tends to slide along a lateral direction of the integrated circuit even though the movement in the longitudinal direction of the latter has been avoided.

Another type of fin structure utilizes an additional frame to surround and enclose the integrated circuit, which causes mounting and maintenance problems of the integrated circuit. Furthermore, the mounting of a fan to the fin by screws is also a problem to users.

Therefore, there has been a long and unfulfilled need for an improved fin assembly for an integrated circuit to mitigate and/or obviate the above problems.

SUMMARY OF THE INVENTION

The present invention provides a fin assembly for dissipating heat generated by an integrated circuit, including a fin, a pair of mounting pieces for removably mounting the fin to the integrated circuit. The fin includes a bottom surface for contacting an upper surface of an integrated circuit and an upper surface from which a plurality of ridges extend. A pair of spaced extensions extend downward from the bottom surface and have a distance between them which equals a width of the integrated circuit.

On at least one of the mutually facing walls of each outermost ridge and its corresponding adjacent ridge, a groove extends along the length of each ridge. Each mounting piece includes a base and two beveled sides each extending downward to form a distal snapping end. A pair of pins extend upward from a top of the base, such that a fan may be mounted by passing the pins through pin holes in the corners of the fan. A plurality of protuberances (preferably on the same level) projects from associated one of two lateral sides of the base, such that when the base of the mounting piece is inserted into the channel defined by each outermost ridge and its corresponding adjacent ridge, the protuberances are fittingly received in the grooves in the ridges, thereby retaining the mounting piece. Preferably, the snapping end extends in a direction parallel to the extending direction of an end surface the protrusion which projects outward from each corner of the integrated circuit to provide a surface contact therebetween.

After installing the mounting pieces onto the fin, the assembled fin assembly is mounted onto the integrated circuit in which each snapping end releasably engages with an associated protrusion of the integrated circuit. As the contact between the snapping end and its associated protrusion is a surface contact, lateral and rotational movements of the fin assembly on the integrated circuit are avoided. Finally, a fan to facilitate the heat dissipation may be mounted above the fin assembly by the pins passing the pin holes therein.

Other objects, advantages, and novel features of the invention will become more apparent from the following detailed description when taken in conjunction with the accompanying drawings.

DETAILED DESCRIPTION OF THE PREFERRED EMBODIMENTS

Figures 4, 7:
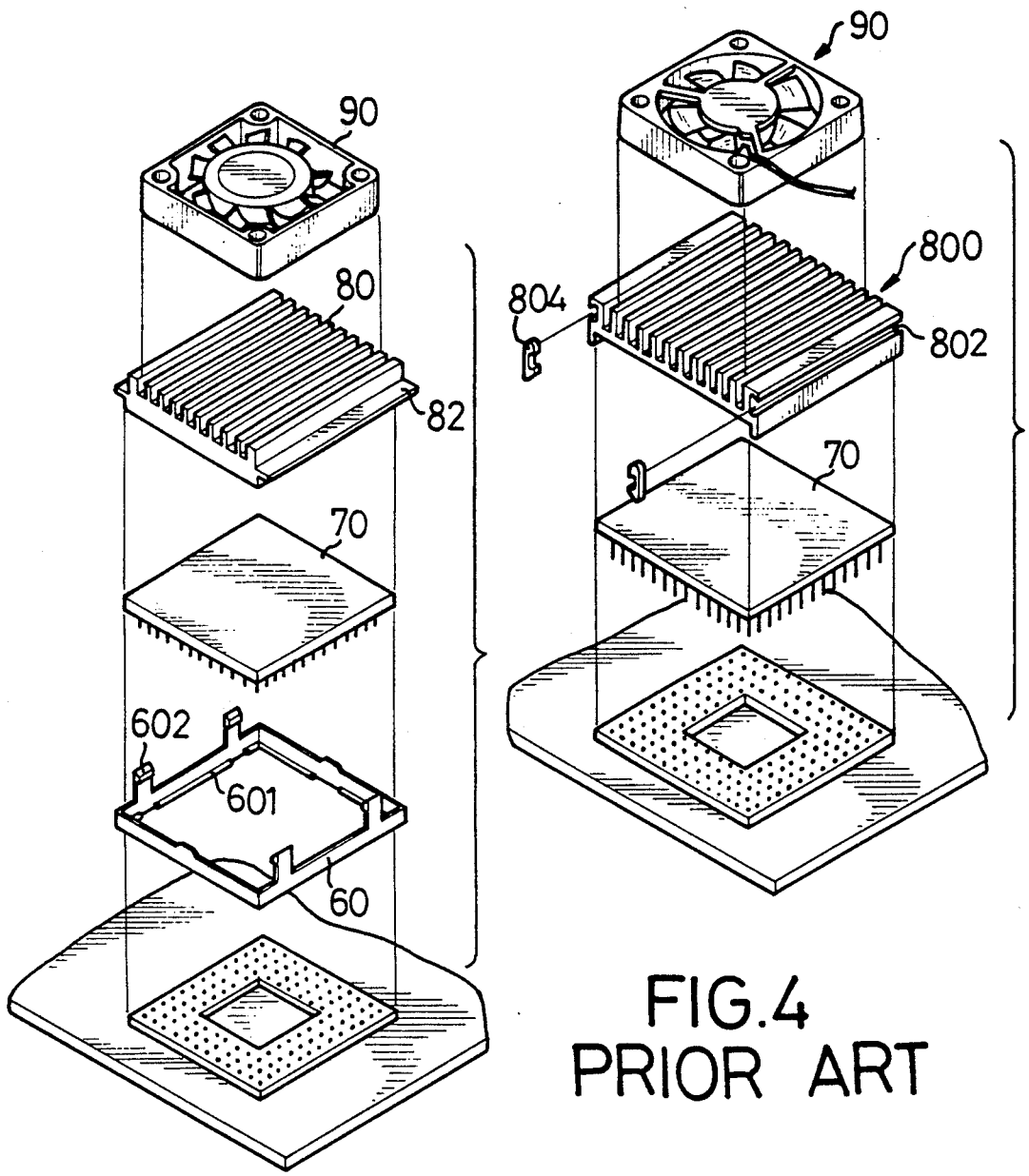
FIG. 4 is an exploded view of a fin structure according to prior art.
FIG. 7 is an exploded view illustrating a further embodiment of a fin structure according to prior art.
Figure 5:
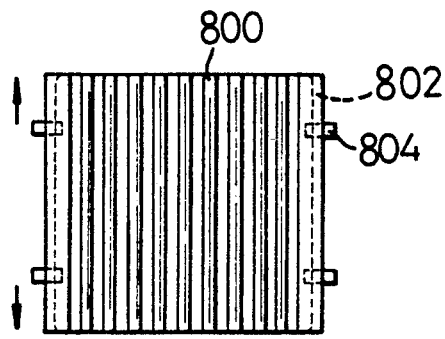
FIG. 5 is a schematic top plan view of the fin structure in FIG. 4.
Figure 6:
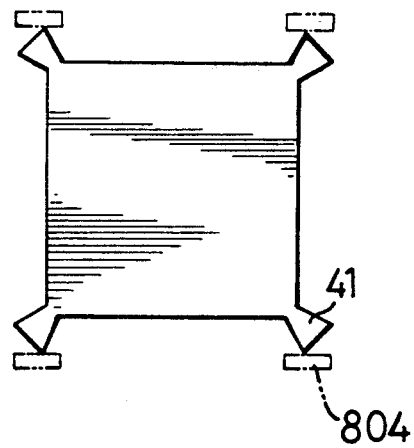
FIG. 6 is a schematic top view illustrating another embodiment of a fin structure according to prior art.

For a better understanding of the background of the invention, reference is firstly made to FIGS. 4 through 7 in which prior art fin structures are shown. Referring to FIGS. 4 and 5, a prior art fin structure 800 generally includes a groove 802 at each of two lateral sides thereof for receiving a snapping member 804 by means of which the fin structure 800 is secured to an integrated circuit 70. A fan 90 to assist in the dissipation of heat generated by the integrated circuit is mounted to the fin structure 800 by screws (not shown) in which the fin is apt to be damaged by the screws. As shown in FIG. 5, although the fin structure 800 cannot move along the longitudinal direction of integrated circuit 70, the former still has the possibility of sliding along the lateral sides of the latter, as indicated by the arrows in this figure. FIG. 6 shows a different arrangement of the fin structure in which the hook member 804 is placed at each of four corners of the fin structure to mate with the protrusions 41 formed on the corners of the integrated circuit. It is, however, found that the fin structure still tends to turn around the integrated circuit as having a point contact therebetween.

FIG. 7 shows another prior art fin structure which further includes a frame 60 to surround and enclose the integrated circuit 70. The frame 60 includes flange members 601 provided along an inner periphery thereof to restrain the integrated circuit 70. A plurality of snapping members 602 extend upward from the frame 60 to engage with a ledge 82 extending along each of two lateral sides of the fin structure 80 after the integrated circuit 70 has been mounted to the printed circuit board (not labeled) by soldering. Similarly, a fan 90 is mounted by screws to the fin structure 80. Although the lateral sliding problem of the fin structure is avoided, this design results in difficulty in soldering as a frame 60 is added between the printed circuit board and the integrated circuit 70, and also causes difficulty in the disassembling of the fin structure 80. Furthermore, the assembling problem of the fan 90 still exists.

Figure 1:
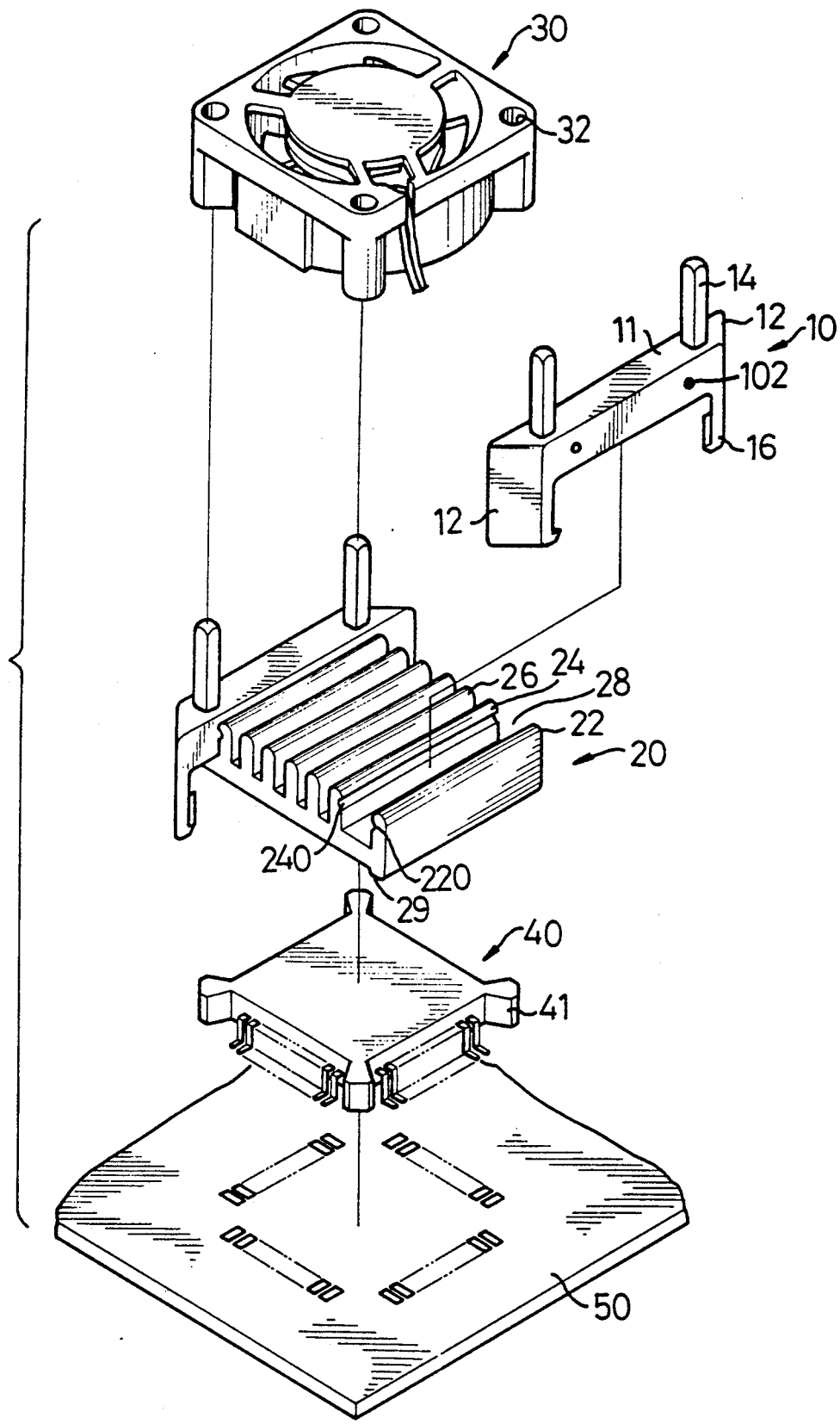
FIG. 1 is an exploded view of an integrated circuit and a fin assembly in accordance with the present invention.
Figure 2:
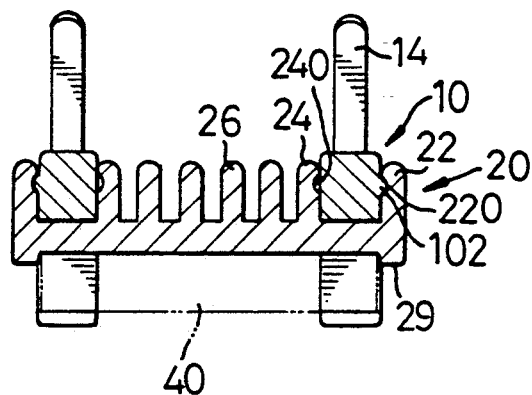
FIG. 2 is a side cross-sectional view of the fin assembly mounted on the integrated circuit.
Figure 3:
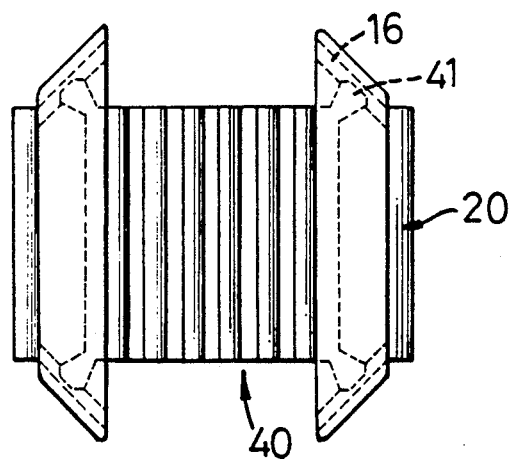
FIG. 3 is a top plan view of the fin assembly of the present invention.

Referring now to FIGS. 1 through 3, the present invention provides a fin assembly for dissipating heat generated by an integrated circuit 40 which mounted on a printed circuit board 50, including a fin 20, a pair of mounting pieces 10 for removably mounting the fin 20 to the integrated circuit 40. The fin 20 includes a bottom surface for contacting an upper surface of an integrated circuit and an upper surface from which a plurality of ridges 22, 24, and 26 extend. A pair of spaced extensions 29 (only one of them is shown) extend downward from the bottom surface and have a distance between them which equals a width of the integrated circuit. This has an advantage of preventing the longitudinal movement of the fin 20 on the integrated circuit 40.

A channel is formed between each two adjacent ridges. On at least one of the mutually facing walls of each outermost ridge 22 and its corresponding adjacent ridge 24, a groove 240, 220 extends along the length of each ridge 22, 24. Each mounting piece 10 includes a base 11 and two beveled sides 12 each extending downward to form a distal snapping end 16. A pair of pins 14 extend upward from a top of the base 11, such that a fan 30 may be mounted by passing the pins 14 through pin holes 32 in the corners of the fan 30. A plurality of protuberances 102 (preferably on the same level) projects from associated one of two lateral sides of the base 11, such that when the base 11 of the mounting piece 10 is inserted into the channel 28 defined by each outermost ridge 22 and its corresponding adjacent ridge 24, the protuberances 102 are fittingly received (by snapping) in the grooves 240 and 220 in the ridges 24 and 22, thereby retaining the mounting piece 10. Preferably, the snapping end 16 extends in a direction parallel to the extending direction of an end surface of the protrusion 41 which projects outward from each corner of the integrated circuit 40 to provide a surface contact therebetween.

After installing the mounting pieces 10 onto the fin 20, the assembled fin assembly is mounted onto the integrated circuit 40 in which each snapping end 16 releasably engages with an associated protrusion 41 of the integrated circuit 40. As the contact between the snapping end 16 and its associated protrusion 41 is a surface contact, lateral and rotational movements of the fin assembly on the integrated circuit 40 are avoided. Finally, a fan 30 to facilitate the heat dissipation may be mounted above the fin assembly by the pins 14 passing the pin holes 32 therein. Preferably, the pins 14 and the fan casing are made of plastic to provide a tight and fitting engagement between the pin holes 32 and the pins 14.

Although the invention has been explained in relation to its preferred embodiment, it is to be understood that many other possible modifications and variations can be made without departing from the spirit and scope of the invention as hereinafter claimed.

I claim:

1. A fin assembly for dissipating heat generated by an integrated circuit comprising:

a fin including a bottom surface for contacting an upper surface of an integrated circuit and an upper surface from which a plurality of ridges extend, each two adjacent said ridges defining a channel therebetween; and a mounting piece removably mounted in said channel defined by each outermost said ridge and its corresponding adjacent said ridge for releasably mounting said fin to the integrated circuit, each said mounting piece including a base and two beveled sides each extending downward to form a distal snapping end adapted to releasably engage with a protrusion projecting from each of four corners of the integrated circuit, and a pair of pins extending upward from a top of the base for mounting a fan.

2. The fin assembly as claimed in claim 1 wherein a plurality of protuberances projecting on the same level from two lateral sides of said base of each said mounting piece, and a groove extends on associated one of two mutually facing walls of each outermost said ridge and its corresponding adjacent said ridge and along a length of said ridges for receiving said protuberances to retain said mounting piece.

3. The fin assembly as claimed in claim 1 wherein a pair of spaced extensions extend downward from said bottom surface of said fin and have a distance between them which equals a width of the integrated circuit.

4. The fin assembly as claimed in claim 1 wherein at least one of said snapping end extends in a direction parallel to the extending direction of an end surface of one protrusion of the integrated circuit to provide a surface contact therebetween.

* * * * *